United States Patent [19]

Fujiwara

[11] Patent Number: 5,608,339
[45] Date of Patent: Mar. 4, 1997

[54] DEVICE FOR DRIVING A LED DISPLAY

[75] Inventor: Masayuu Fujiwara, Kyoto, Japan

[73] Assignee: Rohm, Co. Ltd., Kyoto, Japan

[21] Appl. No.: 519,700

[22] Filed: Aug. 28, 1995

[30] Foreign Application Priority Data

Aug. 30, 1994 [JP] Japan .................................. 6-205546

[51] Int. Cl.⁶ ............................................. H03K 19/0185
[52] U.S. Cl. .................... 326/27; 326/34; 326/82
[58] Field of Search ........................ 326/21, 34, 82–83, 326/110, 27; 327/530, 538

[56] References Cited

U.S. PATENT DOCUMENTS 4,274,014  6/1981  Schade, Jr. ........................ 326/110
4,605,907  8/1986  Rosenthal et al. ................. 330/257
5,162,673  11/1992  Ohi ................................... 326/110
5,362,988  11/1994  Hellums ........................... 327/543
5,493,235  2/1996  Khayat ............................... 326/34

*Primary Examiner*—David R. Hudspeth
*Attorney, Agent, or Firm*—Nikaido Marmelstein Murray & Oram LLP

[57] ABSTRACT

A device for driving a load controllable by current capable of increasing speed to turn on an output stage transistor is provided. The device includes: (a) a power source terminal; (b) a switching circuit for switching flow of current and non-flow; and (c) a current mirror circuit connected between an output terminal of the switching circuit and the power source terminal.

6 Claims, 9 Drawing Sheets

DEVICE FOR DRIVING A LED DISPLAY

FIELD OF THE INVENTION

The present invention relates to a device for driving a load controllable by current such as a light emitting element or a display element or a printer head or a liquid crystal element. The device is used in a printer or a display device of various electrical machines and apparatuses such as a video game, for driving a light emitting array or a display array in which a plurality of current controlled type light emitting elements or display elements are connected in parallel.

BACKGROUND OF THE INVENTION

FIG. 9 illustrates a MOS drive circuit as an example of a device for driving a load controllable by current of this type. In the figure, n pieces of LEDs $1_1$ to $1_n$, which are elements controllable by current, are connected in parallel to form a light emitting element array or a display array. In this example, an LED element is used as an element controllable by current. To each of the elements controllable by current, output stage MOS transistors $2_1$ to $2_n$ are connected in series and driving current for the LED is supplied to each element through the output stage MOS transistors. Between the terminals of the source and the gate of the output stage transistors, switching transistors $3_1$ to $3_n$ are connected. A power source voltage Vcc is divided by resistors R1 and R2 for dividing voltage at a point B for obtaining divided voltage, and between the point B for obtaining divided voltage and the gate A of the output stage transistors, the switching elements $4_1$ to $4_n$ are provided. A controller 5 controls turning on and turning off the switching transistors $3_1$ to $3_n$ and the switching elements $4_1$ to $4_n$ on the basis of the data input signal DIN (Data signal IN) from a microcomputer (not shown).

Operations of driving an LED of the above-mentioned conventional driving circuit will be described. For example, to cause the LED $1_1$ to turn on, the switching element $4_1$ is turned on by the output signal from the controller 5 on the basis of the data input signal DIN. By this operation, the divided voltage, 3 volts for example, of the point B for obtaining divided voltage is supplied to the gate A of the output stage transistor $2_1$. Further, since the switching transistor $3_1$ is made to be open at this time by the output signal of the controller 5 and the power source voltage Vcc cannot be supplied to the gate of the output stage transistor $2_1$, only the divided voltage is supplied to the gate A, and the output stage transistor is made to be on. Thus a driving current is supplied to the LED element $1_1$ which is connected in series to the output stage transistor, and the LED element is turned on. To turn off the element, the switching transistor $3_1$ is made to be off by the output signal of the controller 5 (the switching element $4_1$ is turned off at this time). By this operation, the voltage applied to the gate A of the output stage transistor $2_1$ is boosted to the power source voltage Vcc to exceed a conduction threshold voltage, 4 volts for example, of the output stage transistor making the output stage transistor open, and the driving current is stopped to flow to the LED element $1_1$, and the LED element is turned off. In the manner as described above, by the output signal from the controller 5 on the basis of the data input signal DIN, on-off control of the output stage transistors $2_1$ to $2_n$ are performed, and turning on and turning off of each LED element is controlled.

Operations for turning on the above-mentioned output stage transistors $2_1$ to $2_n$ will be described referring to FIG. 10. When the voltage applied to the gate A drops from the power source voltage Vcc (5 volts) to a level further below from the above-mentioned conduction threshold voltage (4 volts) and to the divided voltage (3 volts) of the point B for obtaining divided voltage, the output stage transistor is made to be in an ON state from an OFF state.

In order to change the output stage transistor from the OFF state to the ON state in a manner described above, the time necessary for the applied voltage of the gate so as to change from 5 volts to 3 volts is calculated approximately as about 2.6 τ from the time τ which is decided by the product τ (τ=RC) of the output impedance of the voltage source, that is, a resistance R (combined resistance of R1 and R2) of the point B for obtaining divided voltage and the total internal capacity C (gate capacity) of the output stage transistor.

The gate capacity of each output stage transistor itself is approximately 3 pF for example, but normally an array configuration is formed in which approximately 100 output stage transistors are connected in parallel as the output stage transistor for the driving circuit, so that the total gate capacity of the output stage transistors $2_1$ to $2_n$ is approximately 300 pF. The resistance R of the point B for obtaining divided voltage is several kilo-ohms, and assuming that the resistance R of the point B of divided voltage is 2 kΩ for example, the time τ of the above is: τ=2×10³×300×10⁻¹²= 600 nsec. Therefore, the actual delay time of operating to change the output stage transistor from OFF state to ON state is approximated to about 2.6 τ (=1560 nsec.).

As above described, since the output impedance of the point B for obtaining divided voltage due to dividing resistance or capacity of the output stage transistor are relatively large and since the combined capacity of the output transistors becomes large by providing the parallel array of the output stage transistors, there are problems that the speed for the output stage transistor's turning on is delayed, and that the improvement of the speed for driving the LED elements is prevented by the combined capacity. In addition, a large MOS transistor is necessary for the transistor used in the output stage in consideration of the current capability and countermeasures for electrostatic breakdown, etc. In order to flow the driving current of at least 1 mA, for example, if a transistor, the design size W/L of which (W: gate width, L: gate length) of 640/6 is used, the capacity in this case is increased to 4 pF, which is an obstacle to the improvement of the driving speed of the LED element. In particular, as described in the case of the above example, when the time τ is close to approximately 600 nsec., such time is so long that the conventional driving apparatus is not suitable for practical use in driving a light emitting element array or a display array of a video game or the like, for example.

SUMMARY OF THE INVENTION

An object of the present invention is to solve the above-mentioned conventional problems and to provide a device for driving a load controllable by current capable of increasing the speed for turning on the output stage transistor.

In view of the condition that a response speed in a drive of a light emitting array or a display array as described above depends on both the output impedance of a voltage source and the total capacity of the output stage transistor placed in parallel, the inventor of the present invention presents a control to drive the gate voltage of the output stage transistor by a low impedance power source at reduction of the capacity of the output stage transistor and has realized high speed responsiveness.

In accordance with the present invention, there is provided a device for driving a load controllable by current comprising:

(a) a power source terminal;

(b) a switching circuit for switching flow of current and non-flow by an input signal; and (c) a current mirror circuit connected between an output terminal of the switching circuit and the power source terminal, wherein the current mirror circuit comprises a first current path and a second current path, the first current path, the current of which is smaller than that of the second current path, being connected between the power source terminal and the output terminal, and the second current path being connectable between the power source terminal and the load.

In accordance with another aspect of the present invention, there is also provided a device of driving a load controllable by current comprising:

(d) a power source capable of supplying current;

(e) a switching circuit for switching flow of current and non-flow by an input signal; and (f) a voltage source controlling the switching circuit, wherein an output impedance of the voltage source is formed to be low impedance.

According to the present invention, a current mirror circuit is connected between the output stage transistor in the switching circuit and the terminal of the power source, so that the current path through which current flows for the output stage transistor and the current path through which current is supplied to the loads are formed, respectively. Thus by adjusting the current mirror ratio of the current mirror circuit, a current flowing through the output stage transistor can be diminished and a current being supplied to the loads can be increased up to a large volume current required. As a result, the output stage transistors are formed by transistors of small capacity.

Accordingly, C which is related to τ (τ=RC, R represents an output impedance on the voltage source side, C represents a capacity of the output stage transistor) concerning a delay of switching time can be diminished. Letting the current mirror ratio approximately 1:5, the capacity in the output transistor can be lowered, and also the switching time can be shortened.

In addition, since a circuit for lowering impedance which lowers an output impedance on the power source side is provided, above-mentioned R related to the formula: τ=RC can be diminished, and the switching time can be shortened further. The above-mentioned R is preferably at most approximately 10 Ω.

The first current path of the output stage transistor and the current mirror circuit and the second current path can be formed with MOS transistors.

DETAILED DESCRIPTION

The embodiments of the present invention will be more particularly described referring to the accompanying drawings.

Figure 1:
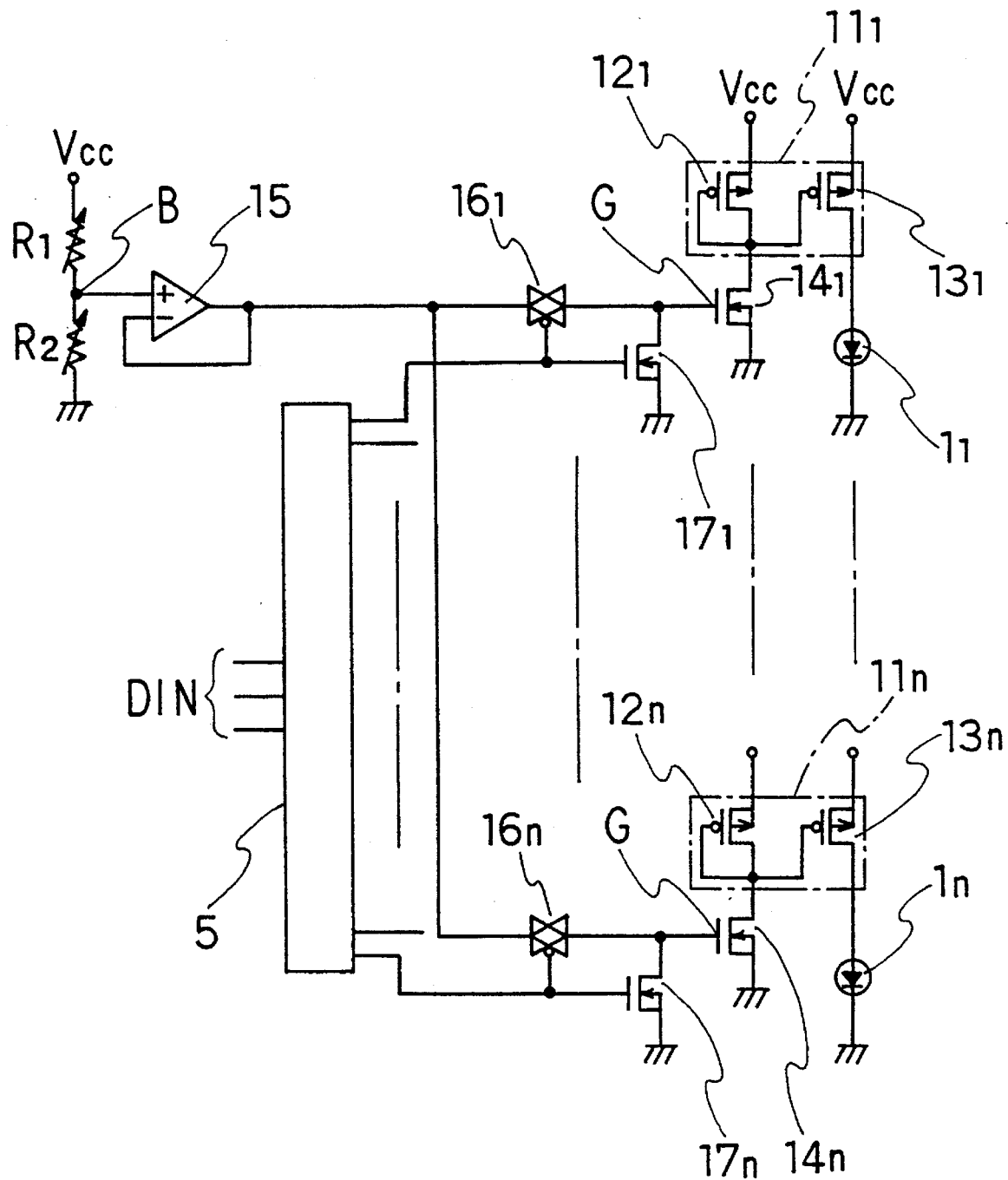
FIG. 1 is a circuit block diagram illustrating the device for an LED display which is an embodiment according to the present invention.
Figure 9:
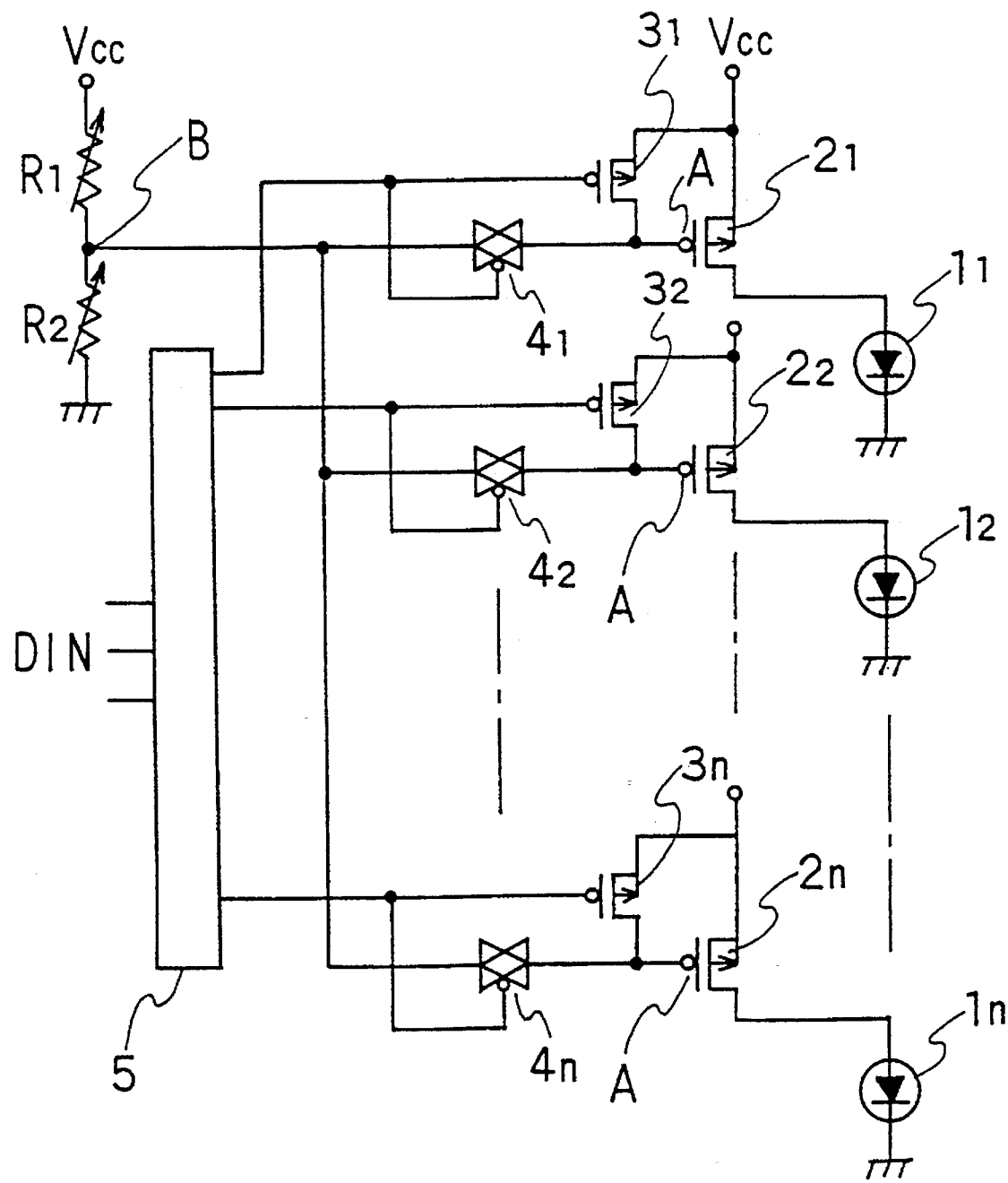
FIG. 9 is a circuit block diagram illustrating a conventional driving apparatus for LED display.

FIG. 1 is a diagrammatic illustration of a device for driving an LED display of an embodiment of the present invention. In FIG. 1, in a MOS driving circuit used in this embodiment, the same portion of the conventional circuit shown in FIG. 9 is denoted with the same symbols and the explanation there of is thus omitted.

First, n pieces of LED elements $1_1$ to $1_n$ are connected in parallel, and each LED element is connected to the output stage MOS transistors in a switching circuit $14_1$ to $14_n$ through the current mirror circuits $11_1$ to $11_n$, respectively. The current mirror circuits $11_1$ to $11_n$ comprises pairs of MOS transistors $12_1$ and $13_1$, $12_2$ and $13_2$, ..., $12_n$ and $13_n$ constituting the first current path and the second current path respectively connected to mirrors, and the MOS transistors $12_1$ to $12_n$ are respectively connected in series between the output stage MOS transistors $14_1$ to $14_n$ and the power source terminal. At the point B for obtaining divided voltage of a bias circuit comprising the resistors for dividing voltage, where the power source voltage Vcc is divided, R1 and R2 are connected to the operating amplifier 15, and the output terminal of such an operating amplifier 15 is connected to the switching elements $16_1$ to $16_n$, so that the output terminal and the inverted input terminal are connected to constitute a full feedback type operating amplifier. To the gate G of the output stage transistors $14_1$ to $14_n$, the output of the switching elements $16_1$ to $16_n$ is connected, and the divided voltage by the bias circuit of the point B for obtaining divided voltage is supplied as the control voltage through the switching elements $16_1$ to $16_n$, and between the gate G and the switching elements $16_1$ to $16_n$, the switching transistors $17_1$ to $17_n$ are connected. That is, the switching elements $16_1$ to $16_n$, the switching transistors $17_1$ to $17_n$, and the output stage transistors $14_1$ to $14_n$ comprise the switching circuit, the switching elements $16_1$ to $16_n$ and the transistors $17_1$ to $17_n$ are controlled to turn on or turn off by a data input signal DIN from a microcomputer (not shown) to the controller 5; and the control signal is output from the output transistor $14_1$ to $14_n$.

Figure 2:
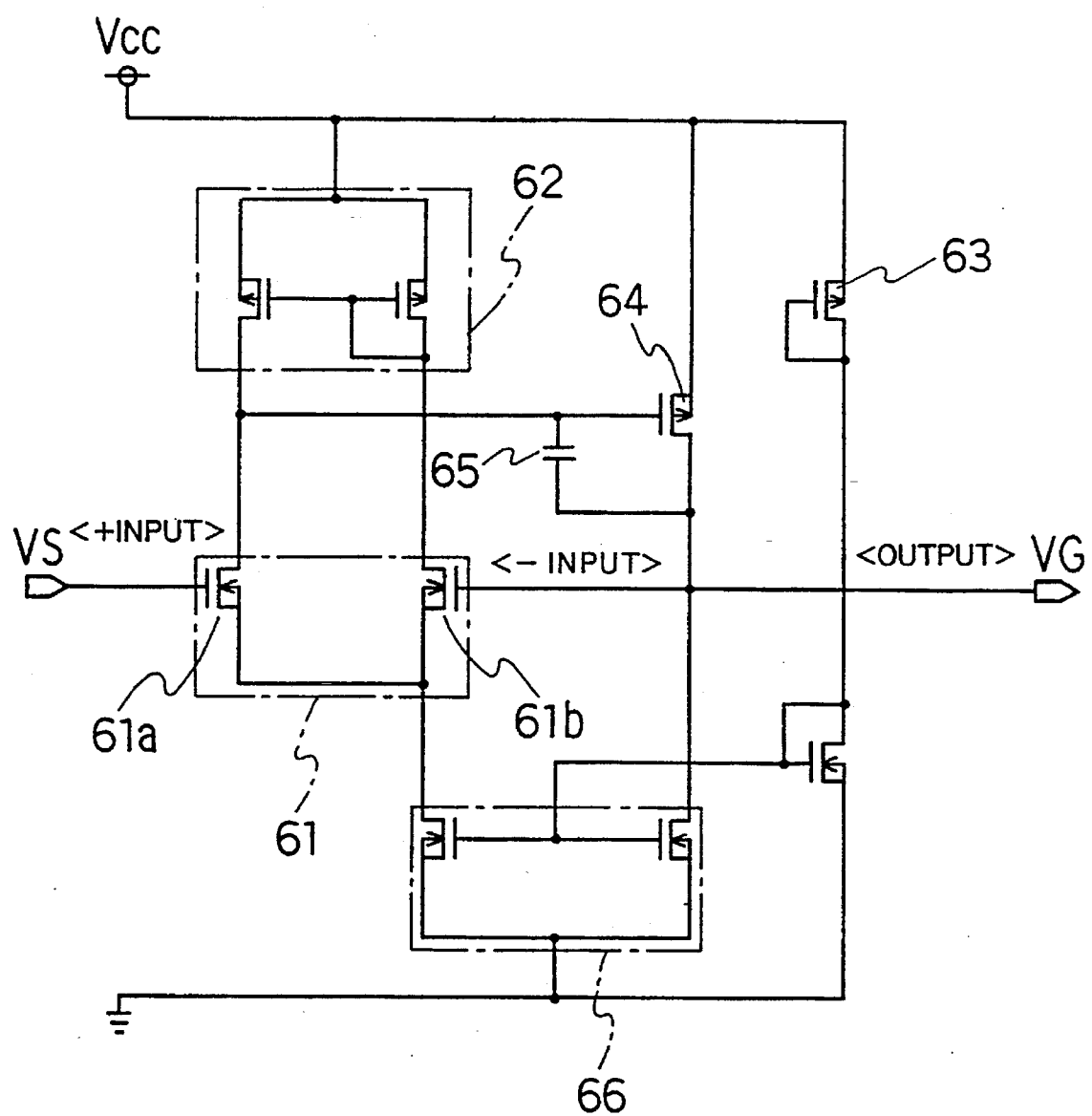
FIG. 2 is a circuit diagram illustrating an example of a circuit configuration of an operating amplifier used in the embodiment according to the present invention.

The reference numeral 18 (see FIG. 8) is a capacitor for increasing current capability connected between the output terminal and ground. The above-mentioned operating amplifier 15 has been provided to lower the output impedance of the voltage source, that is to say, in order to make the output resistance of point B small for obtaining the divided voltage, the output resistance acting on the gate G of the output stage transistors $14_1$ to $14_n$. As shown in the example of a structure of FIG. 2, the operating amplifier 15 comprises (1) a differential circuit 61, (2) the current mirror circuit 62 which is to become the constant-current stabilized power for supplying current to the pair of differential transistor 61a and 61b of this differential circuit 61, (3) the current source transistor 63 for supplying current to the output stage transistor 64 of the differential circuit 61, (4) the capacitor 65 to prevent oscillation, and (5) the current mirror circuit 66 to form the constant-current stabilized power to supply current to each part. The divided voltage of point B for obtaining divided voltage is given to the input VS, and the output VG is connected in common to the switching elements $16_1$ to $16_n$. By supplying the divided voltage to the gate G of the output stage transistors $14_1$ to $14_n$ through the full feedback type operating amplifier such as above, it is possible to produce several tens of ohms of the output resistance acting on the gate G. In addition, in this example the full feedback type operating amplifier of the N Channel transistor base employed, but a full feedback type operating amplifier of the P channel transistor base may also be used.

Figure 3:
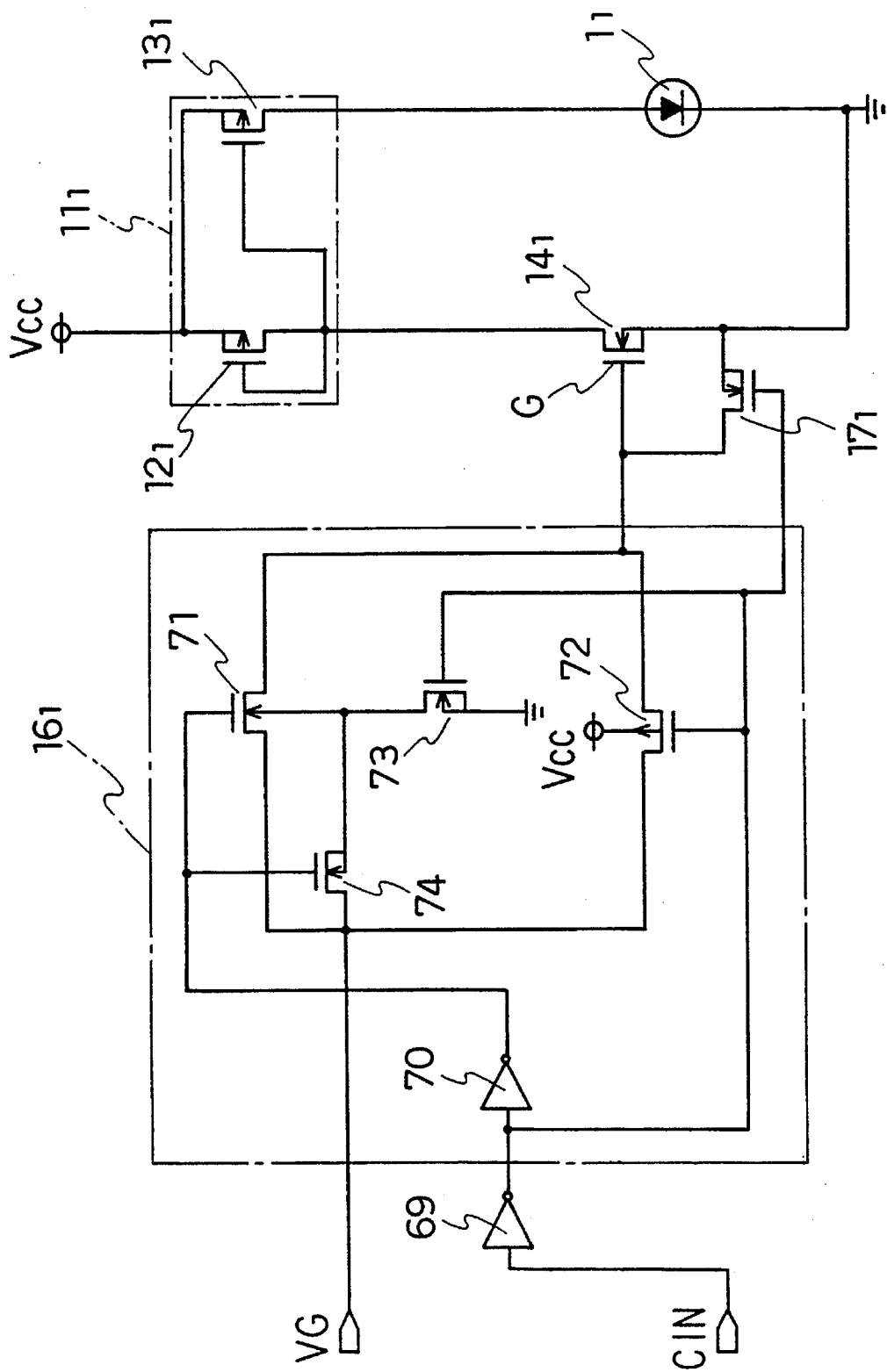
FIG. 3 is a circuit diagram illustrating a circuit configuration around the output stage transistor in the embodiment according to the present invention.

A structure of the switching elements $16_1$ to $16_n$ and the output stage circuit for driving the LED will be described further. FIG. 3 shows an example of such a driving output stage circuit for the LED element $1_1$.

The switching element $16_1$ has a pair of MOS transistors 71 and 72 connected in common to a source and a drain, and functions as an analog switch to transmit to a driving output stage side. The output VG of the operating amplifier 15 is input between both MOS transistors by a control signal CIN (Control signal IN) from the controller 5. On the substrate side of the N channel transistor 71, transistors 73 and 74 are provided to increase the switching responsiveness, and the source and the drain of the transistor 74 are provided between the substrate of the N channnel transistor 71 and the input point of the output VG of the operating amplifier 15. Both transistors 71 and 72 are connected in common to the input point. To the gates of the P channel transistor 72 and the transistor 73, the control signal CIN is given through the invertor 69. To the gates of the N channel transistor 71 and the transistor 74, the control signal CIN is given through invertors 69 and 70.

The gate G of the output stage transistor $14_1$ of the output stage for driving LED is connected to the side of one common connecting point of the pair of transistors 71 and 72, and the source and the drain are connected between the transistor $12_1$ and ground. The transistor 12 is connected to one diode of the current mirror circuit $11_1$. The other transistor $13_1$ constituting the second current path, which is the current mirror connected to the transistor $12_1$ constituting the first current path, is connected to the other anode side of the LED element $1_1$. The source and the drain of the MOS switching transistor $17_1$ are connected between the gate of the transistor $14_1$ and the cathode (ground) of the LED element $1_1$ which is a load. The control signal CIN is given to the gate of the transistor $17_1$ through the invertor 69.

Next, operations of driving the LED according to the present embodiment will be described. In this case, the conduction threshold voltage of the output stage transistor $14_1$ is set to 4 volts, the supply voltage Vcc is set to 5 volts, the divided voltage of the point B for obtaining divided voltage, that is, the output voltage of the operating amplifier 15 is set to 2 volts, and the peak value is set to the same 5 volts as the voltage of the power source voltage Vcc when the control signal CIN is turned on.

For example, when turning on LED $1_1$, the switching transistor $17_1$ is turned off by the control signal CIN ("H" signal). Concurrently the switching element $16_1$ is turned on, the output voltage of 2 volts of the operating amplifier $15_1$ is applied to the gate G of the output stage transistor $14_1$, and the transistor $14_1$ is turned on. By this condition, since the current is supplied through the current mirror circuit $11_1$, inverted current is given to the LED element $1_1$ as the driving current through the transistor $13_1$ so as to turn on the LED element.

When turning off the LED element $1_1$, the switching transistor $17_1$ is turned on by the control signal CIN ("L" signal), and the switching element $16_1$ is turned off. By this conduction of this transistor $17_1$, the electric potential at the connecting points between the output stage transistor $14_1$ and the switching element $16_1$, that is, a connecting point of gate G of the output stage transistor and the switching element $16_1$ is lowered, and when the N channel transistor $14_1$ is turned off, the current to the LED element $1_1$ stops flowing, letting the LED element turn off.

In the present embodiment, the switching transistor $17_1$ lowers the voltage of the gate G of the output stage transistor $14_1$ and turns off the LED element, but a switching transistor may also be used by connecting the switching transistor at a position to switch the gate voltage of the transistor $13_1$ which is connected on the anode side of the LED element $1_1$ of the current mirror circuit $11_1$.

Next, the operating responsiveness of the output stage transistor in the present embodiment, that is, the response time characteristic of the LED element for changing from turning off to turning on, will be described referring to FIG. 4 and FIG. 5.

Figure 10:
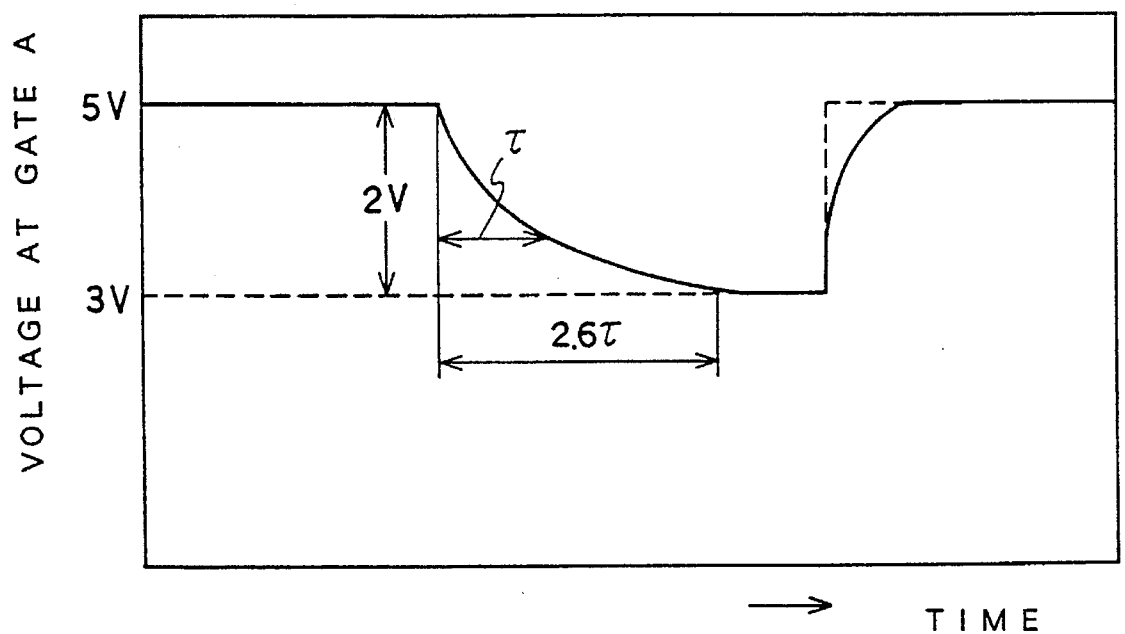
FIG. 10 is a voltage relative to time characteristic diagram showing the operating responsiveness of the output stage transistor of FIG. 9.

The operating responsiveness in the present embodiment will be described by way of comparison with the operating responsiveness wherein the output impedance of the voltage source is caused to be lowered only by inserting the operating amplifier 15 to the point B for obtaining divided voltage of the conventional circuit shown in FIG. 9. As shown in FIG. 9 and FIG. 10, the response time necessary to lower the gate applied voltage to a specified value in order to turn on such an output stage transistor from an OFF state is 2.6 τ (=2.6 RC, R: resistance of the point for obtaining divided voltage B, C: total gate capacity of all output stage transistors). Therefore, when only the operating amplifier 15 is inserted to the point B for obtaining divided voltage of this conventional circuit, the operation delay time $T_1$ for changing from an OFF state to an ON state of the output stage transistor in this case is expressed approximately by the following relationship (1).

$$T_1 = 2.6 \times \tau_1 \quad (1)$$
$$= 2.6(Zout + Rs/n) \times n \times Cc$$

where, $\tau_1$ is the response time when the gate applied voltage is changed, Zout is the output resistance of the operating amplifier 15, Rs is a resistance of each element of the switching elements $16_1$ to $16_n$ (Rs/n: parallel resistance of all n pieces of switching elements) and Cc is the capacity of the Output stage transistors $2_1$ to $2_n$ (refer to FIG. 9). The coefficient 2.6 is a theoretical conversion coefficient when at least 90% of the output stage transistors are changed from the OFF state to the ON state. With regard to this theoretical design, details thereof are indicated in "Design technology for semiconductor circuit" (published by Nikkei McGrow Hill Kabushiki Kaisha, 1988, pp30–35) and the like, for example.

Then, when driving 128 LED elements (n=128) with Zout being set to 100Ω, Rs to 500Ω, and Cc to 4 pF, according to the relationship (1) of above, the theoretical value of the delay time $T_1$ is obtained as follows:

$$T_1 = 2.6 \times (100 + 500/128) \times 128 \times 4 \times 10^{-12} \quad (2)$$
$$= 138 (nsec)$$

As compared with the above case, the operation delay time $T_2$ from the OFF state to the ON state in the present embodiment is approximately expressed by the following relationship (3). It should be noted that the delay time $T_3$ for driving current of the LED element through the current mirror circuit $11_1$ after the output stage transistor $14_1$ has been turned on, is added to this delay time $T_2$.

$$T_2 = 2.6 \tau_2 + T_3 \quad (3)$$
$$= 2.6(Zout + Rs/n) \times n \times Ca + T_3$$

In this case, $\tau_2$ is the response time when the gate applied voltage in the present embodiment is changed, and Ca is the capacity of each of the output stage transistors $14_1$ to $14_n$. $T_3$ can be obtained by the relationship $T_3 = CcV/I$, using the capacity (set to 4 pF which is the same value as Cc) of the transistor $13_1$, applied voltage of the switching transistor $17_1$, that is, the output voltage V of the operating amplifier 15 (set to 2 volts in this case), and the current I through the output stage transistor $14_1$.

Then, the theoretical value of the delay time $T_2$ for driving 128 (n=128) LED elements is obtained as in the case of above, Zout and Rs are set to 100Ω and 500Ω respectively as in the case of above.

In the case of the present embodiment, since the LED element is driven by current through the current mirror circuit $11_1$, the driving current is set by the current mirror ratio of the transistors $12_1$ and $13_1$. For example, when supplying 2.5 mA of the driving current of the LED element, the current mirror ratio of the transistors $12_1$ and $13_1$ is set to 1:5, thereby allowing the current I of approximately 0.5 mA to flow to the output stage transistor $14_1$. In comparison with the conventional manner wherein the output stage transistor $2_1$ shown in FIG. 9 directly drives the LED elements, by obtaining the LED driving current by inverted current through the current mirror circuit, it is possible to substantially lower the current capability of the MOS device of the output stage transistor $14_1$ and to design the gate size W/L (W: gate width, L: gate length) of the MOS device smaller to approximately 1/10 than a conventional output transistor. In other words, as examples of the design size simulation of W (gate width)/L (gate length) of the pair of transistors $12_1$ and $13_1$ and the output stage transistor $14_1$, each value of W/L 36/1.8, 640/6, and 18/1.8 are obtained, respectively. Further, since the current capability of the transistor $12_1$ and the output stage transistor $14_1$ are smaller than that of the transistor $13_1$, each capacity can be set to 0.07 pF and 0.03 pF (=Ca).

When the above-mentioned setting conditions are applied to the relationship (3), and the delay time $T_2$ is obtained as follows:

$$T_2 = 2.6 \times (100+500/128) \times 128 \times 0.03 \times 10^{-12} + T_3$$

On the other hand, because $T_3 = 4 \times 10^{-12} \times 2/0.5 \times 10^{-3} = 16$ (nsec.), the following relationship is formulated.

$$T_2 = 1 + 16 = 17 \ (nsec.) \quad (4)$$

As have been described above, when the response delay time from the OFF state to the ON state of the output stage transistor is compared (refer to the relationships (2) and (4)), in the case of the present embodiment, it possible to substantially lower the response delay to approximately 1/10 as compared to the case wherein the output resistance is lowered simply by the operating amplifier 15.

In other words, by driving the LED element by the current through the current mirror circuit $11_1$ to $11_n$, it is possible to use the output stage transistors $14_1$ to $14_n$ which requires less operating current and to substantially lower the response time ($T_2$ excluding $T_3$) concerning the output stage transistor, so that the response time ($T_3$) concerning the transistors $13_1$ to $13_n$ on the inverted side where the inverted current flows as driving current for the LED mainly influences the delay time $T_2$, since each capacity of the transistors $13_1$ to $13_n$ does not appear as a product of the output impedance on the power source, a delay of the response time $T_3$ concerning transistors $13_1$ to $13_n$ is small. But it is possible to achieve high speed responsiveness in general, thereby shortening the response time.

Figure 4:
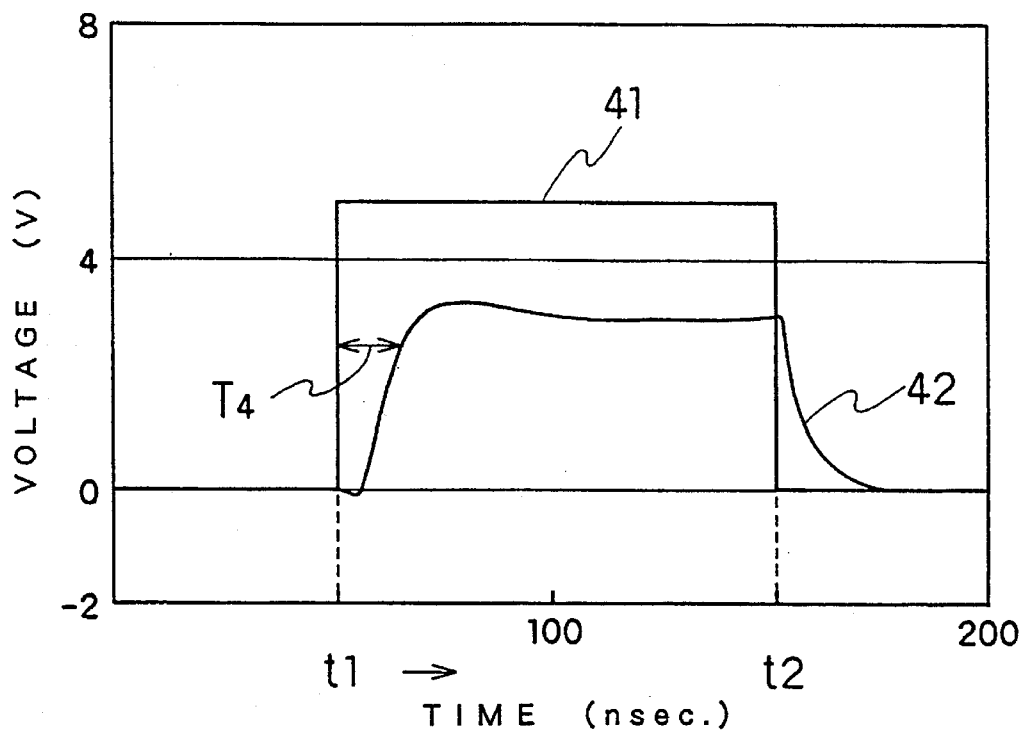
FIG. 4 is a voltage relative to time characteristic diagram illustrating the operating responsiveness of the output stage transistor of the embodiment according to the present invention.
Figure 5:
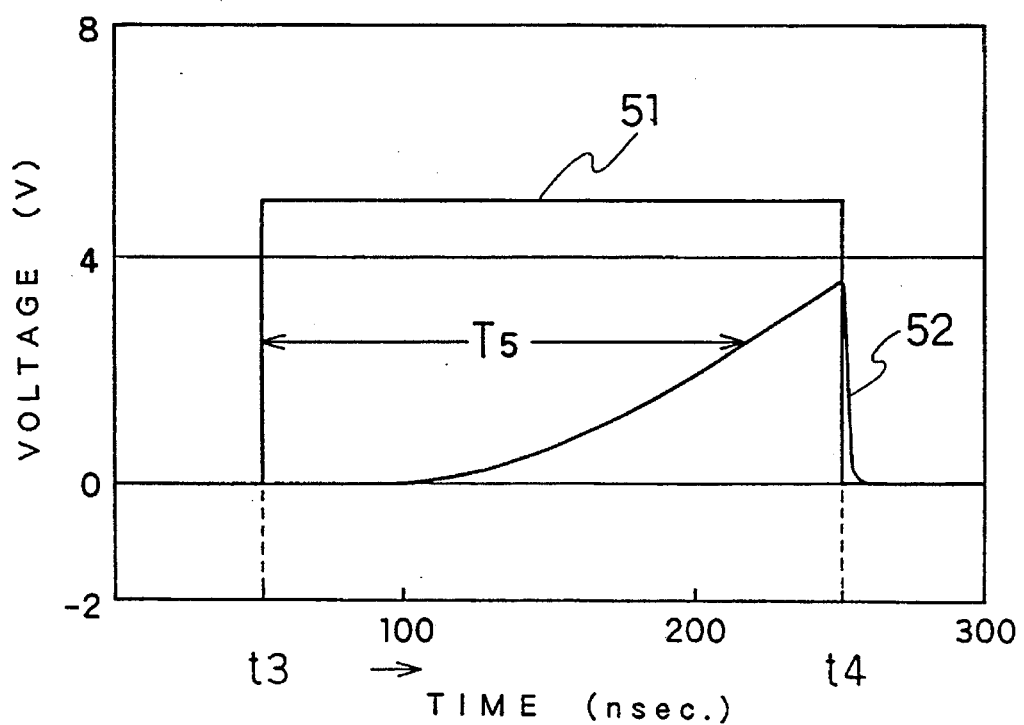
FIG. 5 is a voltage relative to time characteristic diagram to explain the operating responsiveness illustrated in FIG. 4.

The difference of the response time will be more apparent from the simulation waveform diagram shown in FIG. 4 and FIG. 5 obtained under the above conditions. In both figures, the axis of the ordinate and the axis of the abscissa indicate voltage and time respectively, and FIG. 4 illustrates the example of the present embodiment described in the relationships (3) and (4), and FIG. 5 illustrates the change from non-driving state to driving stage respectively of LED element $1_1$ only in the case of the operating amplifier 15 described in the relationships (1) and (2). Reference numerals 41 and 51 denote the ON operation state of the control signal CIN of the peak value of 5 volts set in the same manner as the power source voltage Vcc, and reference numerals 42 and 52 show a change in applied voltage between the anode and cathode of the LED element $1_1$.

In the case of FIG. 4, the control signal CIN is turned ON during a period from $t_1$ to $t_2$, the LED element rises sharply to the driving state during the rise time ($T_4$) when the control signal CIN is turned on, and this $T_4$ is approximately 16 nsec. similar to the theoretical value of the above relationship (4). On the other hand, in FIG. 5, the control signal CIN is turned on during a period from $t_3$ to $t_4$, the LED element rises slowly to the driving state during the rise time ($T_5$) when the control signal CIN is turned on, and this $T_5$ is approximately 170 nsec. which is slightly longer than the theoretical value of the above relationship (2).

Arranging an array by using a plurality of the output stage transistors $14_1$ to $14_n$, turning on and turning off a display in which light emitting elements are set in the array are performed quickly and correctly, therefore an enhanced effective displaying is obtained.

As a result, a heating device for thermosensible paper used in a printer and can be constituted to obtain high sensitivity.

Next, an action of a capacitor which is employed on the output of an operational amplifier for increasing the current capability is explained as follows:

In order to enhance the luminance of LED elements as light emitting devices or a display array, it is necessary that enough driving current is supplied to the LED elements by use of an output stage transistor having a large current capability. Increasing the current capability lengthens an operating time from the OFF state to the ON state, which is decided by a relationship $\tau$=Rc, since internal capacity of the output stage transistor becomes large.

Moreover, a value of a current capability of the operational amplifier including IC is approximately 10 mA, and when a current capacity is running short, lengthening a value of output voltage becomes higher, thus lengthening the operating time.

For example, a time for lowering the base voltage of the output stage transistor $14_1$ to $14_n$, from, for example, 5 volts down to 3 volts, that is, the time τ for the output shape transistor's changing from the OFF state to the ON state is represented by the following relationship.

$$C \Delta V = I\tau \quad (5)$$

$$\tau = \frac{C \Delta V}{I} = \frac{300 \text{ pF}}{10 \text{ mA}} \times 2 \text{ V} = 60 \text{ nsec}$$

Figure 6:
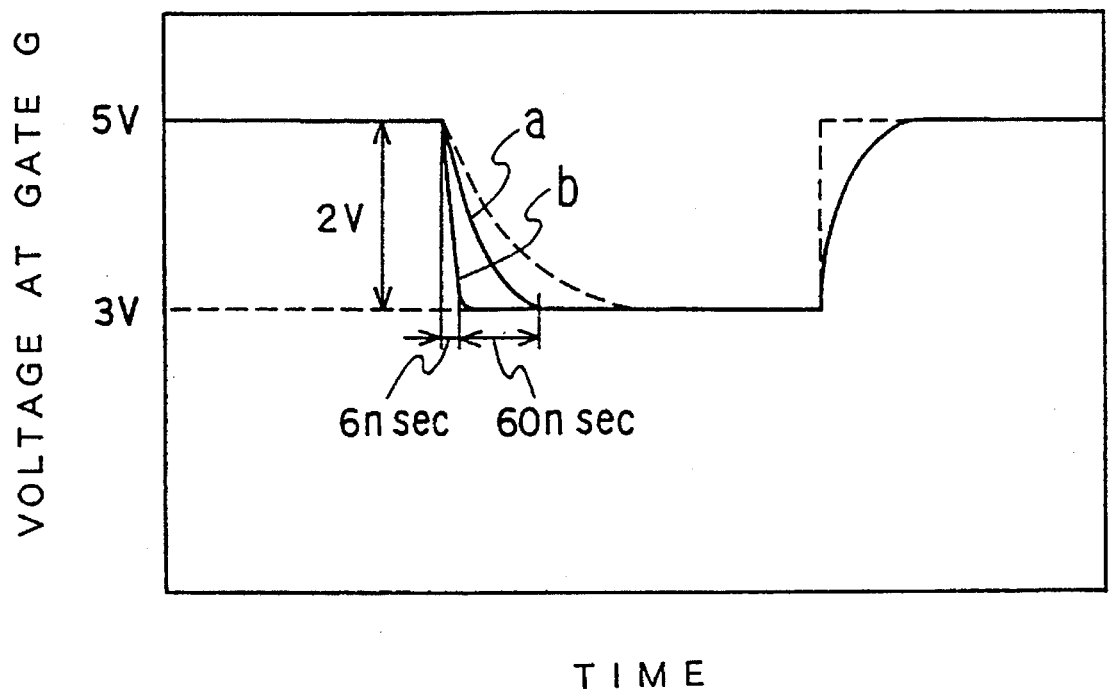
FIG. 6 is a characteristic diagram illustrating an operating speed of an output stage transistor.

In the relationship, as denoted by reference symbols a in FIG. 6 the time τ is shortened to one-tenth from 600 nsec. (denoted by dotted line in FIG. 6) in the conventional case. The time τ, however, cannot be shortened further.

Therefore, to supplement the current capability, a capacitor 18 for increasing the current capability is connected additionally outwards between the output terminal of the operational amplifier and ground E. The charge of the capacitor Q (Q=CV) increases momentary the current capability during the operation from the OFF state to the ON state of the output stage transistors $14_1$ to $14_n$, while the current capability is insufficinet only with the operational amplifier 15, thus ensuring to speed up the operating time of output stage transistors $14_1$ to $14_n$.

Now in order to let the time τ be 6 nsec., the current capability of 100 mA is required, if the capacitor 18 of 0.01 μF for increasing the current capability is connected to the operational amplifier 15 having the current capability of 10 mA, since the change of the gate voltage of the output transistor is represented in the following relationship and the charge Q of the capacitor 18 for increasing the current capability is represented by Q=CV, the relationship 5 is calculated as follows:

$$90 \text{ mA} \cdot 6 \text{ nsec} = 0.01 \text{ μF} \Delta V \quad (6)$$

$$\Delta V = \frac{90 \text{ mA} \cdot 6 \text{ nsec}}{0.01 \text{ μF}} = \frac{540 \, p(\text{coulomb})}{10000 \text{ pF}} = 54 \text{ mV}$$

According to the relationship the change of the gate voltage of the output transistor is only 54 (mV), the operating time τ from the OFF state to the ON state of the output stage transistors $14_1$ to $14_n$ can be shortened to substantially constant 6 nsec. stably as shown in a curve denoted by b in FIG. 6.

Figure 7:
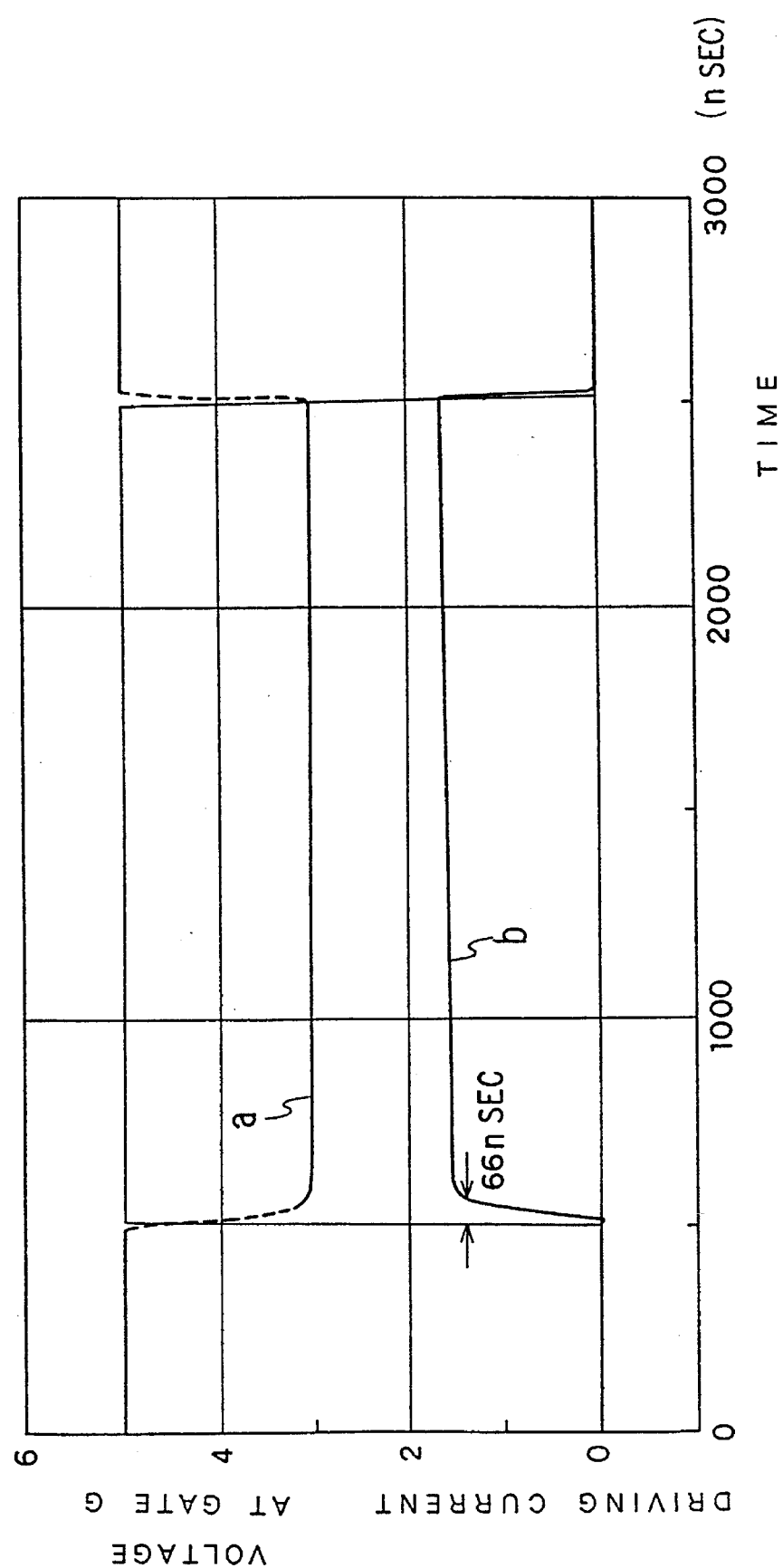
FIG. 7 is a magnified view of characteristic diagram of FIG. 3 illustrating operating speed of an output stage transistor according to the present invention.

FIG. 7 shows a simulation, for the change of the output stage transistors $14_1$ to $14_n$ from the OFF state to the ON state, the output stage transistor being only connected to the operational amplifier. In FIG. 7, the curve a shows the change of the voltage of the gate terminal of the output stage transistors $14_1$ to $14_n$, and a curve b shows a change of the driving current, that is, the change of luminance, of the LED element $1_1$ (to $1_n$).

Then by connecting the capacitor 18 for increasing the current capability between the output of the operational amplifier and ground, both the curve a and the curve b in FIG. 7 become steeper.

Since the capacitor for increasing the current capability is connected to the output of the operational amplifier to supplement the insufficiency of the current capability of the operational amplifier, the operating time for the C-MOS array's changing from the OFF state to the ON state can be surely shortened without increasing the capacitance of C-MOS element and increasing the control voltage which is supplied and applied to the element controllable by current.

Figure 8:
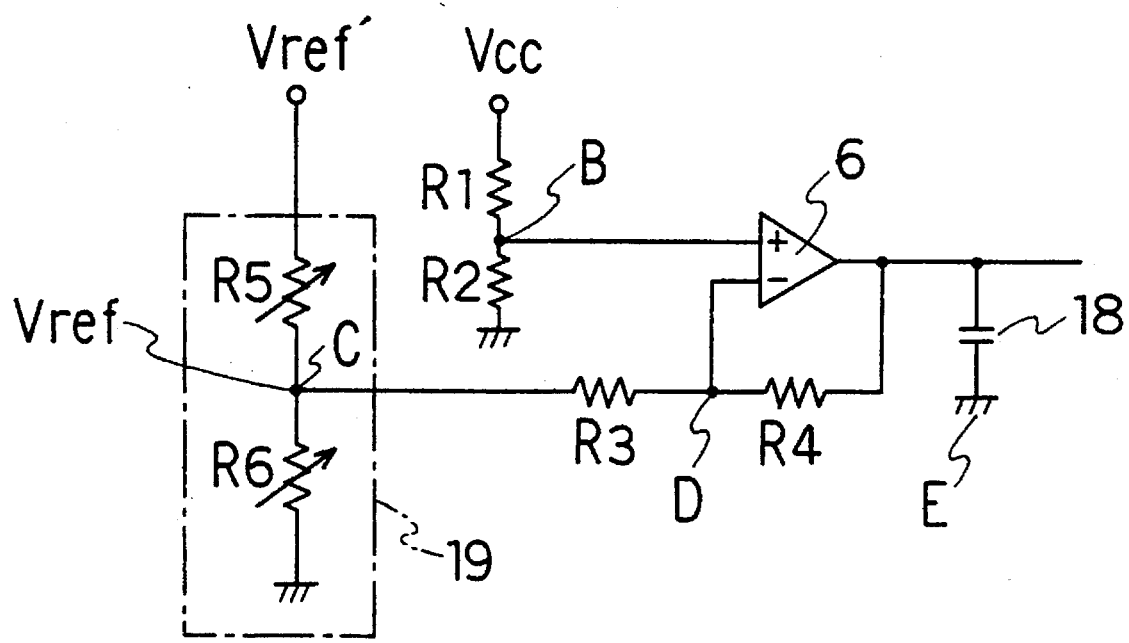
FIG. 8 is a circuit i diagram illustrating a voltage source section according to the present invention.

FIG. 8 shows a voltage. source section in an embodiment wherein a voltage source controlling a switching circuit shown in FIG. 1 is stablized. The others are the same as the embodiment shown in FIG. 1.

In FIG. 8, a reference numeral 19 is a stabilized voltage source, $R_3$ and $R_4$, both $R_3$ and $R_4$ constituting the second resistors for dividing voltage, are the third resistor for dividing voltage and the fourth resistor for dividing voltage which are connected in series between an output terminal of the operational amplifier and a divided voltage point C of the resistors $R_5$ and $R_6$ both connected in series, which constitute the stabilized voltage source. Further, by connecting the second point D for obtaining divided voltage between $R_3$ and $R_4$ which are constituting the second resistors for dividing voltage to an inverted input terminal of the operational amplifier 15, an inverted type operational amplifier is constituted.

Now, supposing that $V_{cc}$ is a power source, and that $V_{ref}$ is the voltage at the point C of the stabilized voltage source in FIG. 8, and $V_{GS}$ represents a voltage difference between the power source $V_{cc}$ and the gate voltage $V_o$ of the output stage transistors $14_1$ (to $14_n$), the voltage $V_{GS}$ according to this above mentioned embodiment represented by the following relationship:

$$V_{GS} = V_{CC} - \left\{ \frac{R_2}{R_1+R_2} V_{CC} - \left( V_{ref} - \frac{R_2}{R_1+R_2} V_{cc} \right) \frac{R_3}{R_4} \right\} \quad (7)$$

$$= V_{ref}$$

where $R_1=R_2$, $R_3=R_4$

It is clear by the relationship that even if the power source $V_{cc}$ is changed, the voltage $V_{GS}$ is not changed because of being equal to the output voltage $V_{ref}$ of the stabilized voltage source 19. Therefore, a driving current $I_{DS}$ which is decided by the general relationship concerning the MOS transistor: $I_{DS}=k(V_{GS}-V_T)^2$ is not changed. The stable driving current can be provided for the LED$_s$ $1_1$ to $1_n$ (see FIG. 1) as an element controllable by current through the output stage transistors $14_1$ to $14_n$ (See FIG. 1) as a MOS element.

Here k represents a coefficient of a capability of the output stage transistors $14_1$ to $14_n$, and is shown by the following relationship, where a W represents a channel width, L represents a channel length, μs represents carriers' mobility in the surface of the transistor and Cos represents gate capacitance.

$$k = \frac{W}{L} \text{ μs Cos} \quad (8)$$

When the ratio of the resistance of the first resistance for dividing voltage $R_1$ to the second resistance for dividing voltage $R_2$ is changed, by changing the ratio of the resistance of the third resistance for dividing voltage $R_3$ and the fourth resistance for dividing voltage $R_4$ and by letting both the ratio of the resistance constant, the same effect as the prescribed feature can be obtained.

According to this embodiment, as the point for obtaining divided voltage between the first resistors for dividing voltage and the second resistors for dividing voltage, both resistors being connected in series is connected to the inverted input of the operational amplifier, and the point for obtaining divided voltage between the third resistors for dividing voltage and the fourth resistors for dividing voltage, both resistors being connected in series between a constant voltage source and the output point of the operational amplifier, then an output voltage of the operational amplifier is equal to the voltage source and does not fluctuate even if the voltage of power source fluctuates. Therefore, the driving current flowing through the MOS array does not fluctuate.

(1) The resistance ratio of the first resistors for dividing voltage to the second resistors for dividing voltage, two resistances forming voltage source, and (2) the resistance ratio of the third resistors for dividing voltage to the second resistors for dividing voltage, two resistors constituting the resistance for dividing voltage, are constituted to be constant. Thereby, adjustment of values of resistances becomes simple and suitable for mass production.

According to the present invention, it is possible to supply the inverted current of the current inverted circuit to the element controllable by current as driving current, and to lower a capacity of element and to lower operating current of each of the transistors by setting the current inverted ratio (current mirror ratio) according to such driving current, and therefore, it is possible to substantially shorten the response time when each of the transistors are changed from the OFF state to the ON state, minimize the response time by inserting the current inversion circuit according to lowering of the operating current of such transistors, thereby shortening considerably the delay time as a whole for turning on such a transistor, and achieving high speed responsiveness.

Also, by the element size design of W/L of the MOS transistor, it is possible to easily set an inverted ratio (current mirror ratio), a capacity of the element of each of the transistors, and the operating current to improve such high speed responsiveness.

Further, by lowering the internal impedance of the voltage source and by using the full feedback type amplifier which supplies the voltage source as the control voltage to switching circuits, it is possible to obtain a device for driving a load of simple structure with high speed responsiveness.

After all, by applying the device for driving a load according to the present invention to a display composed of an LED array or the like, displaying devices composed of a variety of light emitting elements capable of high-speed driving are obtained.

Though several embodiments of the present invention are described above, it is to be understood that the present invention is not limited only to the above-mentioned and various changes and modifications may be made in the invention without departing from the spirit and scope thereof.

What is claimed is:

1. A device for driving a load controllable by current comprising:

(a) a power source terminal;

(b) a switching circuit for switching flow of current and nonflow by an input signal; and (c) a current mirror circuit connected between an output terminal of said switching circuit and said power source terminal, wherein said current mirror circuit comprises a first current path and a second current path, said first current path, the current of which is smaller than that of said second current path, being connected between said power source terminal and said output terminal, and said second current path being connectable between said power source terminal and said load;

wherein at least two resistors for dividing voltage are provided between said power source terminal and ground for obtaining a divided voltage, said divided voltage being employed as a controlling voltage for said switching circuit.

2. The device of claim 1, wherein a circuit for lowering an impedance of said resistors is provided between a point for obtaining said divided voltage and said switching circuit.

3. The device of claim 2, wherein the circuit for lowering an impedance is a full feedback type amplifier.

4. The device of claim 1, wherein an output stage of said switching circuit, said first current path and said second current path comprise MOS transistors, respectively.

5. The device of claim 4, wherein a gate size of a first MOS transistor constituting said first current path is formed to be smaller than that of a second MOS transistor constituting said second current path.

6. The device of claim 1 wherein two or more sets of said switching circuit, and one or more sets of said current mirror circuit are provided in parallel, said sets being capable of driving a plurality of loads arranged in parallel concurrently.

* * * * *